US 9,464,350 B2

(12) United States Patent
Mullin et al.

(10) Patent No.: US 9,464,350 B2
(45) Date of Patent: Oct. 11, 2016

(54) DEPOSITION SUBSTRATE TEMPERATURE AND MONITORING

(71) Applicant: United Technologies Corporation, Hartford, CT (US)

(72) Inventors: Richard S. Mullin, Cromwell, CT (US); Anatoly Kuzmichev, Kiev (UA); Igor V. Belousov, Kyiv's Region (UA); Yuriy G. Kononenko, Kyiv (UA); Oleg G. Pankov, Kiev (UA); Dmitriy Ryzhikov, Boyarka (UA)

(73) Assignee: United Techologies Corporation, Farmington, CT (US)

( * ) Notice: Subject to any disclaimer, the term of this patent is extended or adjusted under 35 U.S.C. 154(b) by 0 days.

(21) Appl. No.: 14/215,986

(22) Filed: Mar. 17, 2014

(65) Prior Publication Data

US 2014/0199490 A1    Jul. 17, 2014

Related U.S. Application Data

(63) Continuation of application No. 13/070,846, filed on Mar. 24, 2011, now abandoned.

(51) Int. Cl.
*C23C 14/54* (2006.01)
*G01K 1/02* (2006.01)

(52) U.S. Cl.
CPC ............ *C23C 14/541* (2013.01); *G01K 1/026* (2013.01)

(58) Field of Classification Search
None
See application file for complete search history.

(56) References Cited

U.S. PATENT DOCUMENTS

| 2,615,070 | A |   | 10/1952 | Opocensky |
| 3,940,987 | A |   | 3/1976  | Green et al. |
| 3,978,729 | A | * | 9/1976  | Jacobs ............... 340/870.17 |
| 4,204,547 | A |   | 5/1980  | Allocca |
| 4,560,286 | A |   | 12/1985 | Wickersheim |
| 4,632,056 | A |   | 12/1986 | Stitz et al. |
| 4,669,040 | A |   | 5/1987  | Pettit et al. |
| 4,922,194 | A |   | 5/1990  | Gaussa et al. |
| 5,029,117 | A |   | 7/1991  | Patton |
| 5,203,945 | A |   | 4/1993  | Hasegawa et al. |

(Continued)

FOREIGN PATENT DOCUMENTS

| CN | 2795232   Y | 7/2006 |
| CN | 101413116 A | 4/2009 |

(Continued)

OTHER PUBLICATIONS

P.D. Parry, "Localized substrate heating during ion implantation", J. Vac. Sci. Technol., 1978, vol. 15, No. 1, pp. 111-115.
B.I. Choi et al., "In situ substrate temperature measurement in high-Tc superconducting film deposition", J. Vac. Sci. Technol., 1993, vol. A11, No. 6, pp. 3020-3025.

(Continued)

Primary Examiner — Charles Capozzi
(74) Attorney, Agent, or Firm — Bachman & LaPointe, P.C.

(57) ABSTRACT

An apparatus for depositing a coating on one or more parts (21) has: a chamber (22); a part holder (64) for carrying the part(s); a bias voltage source (94) coupled to the part(s) to apply a bias voltage to the part(s); a source (34) of the coating material; a plurality of temperature sensors (76); and a plurality of leads (90) passing outputs of the temperature sensors out from the chamber. A temperature monitoring system (150) has a temperature data processor (300). At least one fiber optic link (223) couples the temperature data processor to the temperature sensors so as to electrically isolate the temperature data processor from the bias voltage.

17 Claims, 3 Drawing Sheets

(56) References Cited

U.S. PATENT DOCUMENTS

| | | | |
|---|---|---|---|
| 5,388,909 | A | 2/1995 | Johnson et al. |
| 5,564,830 | A | 10/1996 | Bobel et al. |
| 5,568,978 | A | 10/1996 | Johnson et al. |
| 5,876,119 | A | 3/1999 | Ishikawa et al. |
| 6,468,384 | B1 | 10/2002 | Singh et al. |
| 6,596,339 | B1 | 7/2003 | Yaroslavsky |
| 6,709,519 | B2 | 3/2004 | Yaroslavsky |
| 7,509,734 | B2 | 3/2009 | Memmen et al. |
| 2002/0167351 | A1* | 11/2002 | Gerber .................. 327/544 |
| 2004/0061057 | A1 | 4/2004 | Johnson et al. |
| 2004/0172826 | A1 | 9/2004 | Memmen et al. |
| 2005/0072361 | A1 | 4/2005 | Yang et al. |
| 2005/0106876 | A1 | 5/2005 | Taylor, II et al. |
| 2005/0249888 | A1 | 11/2005 | Makhotkin et al. |
| 2007/0284255 | A1 | 12/2007 | Gorokhovsky et al. |
| 2010/0162958 | A1* | 7/2010 | Kurokawa .................. 118/725 |

FOREIGN PATENT DOCUMENTS

| | | | |
|---|---|---|---|
| JP | 60245776 | A | 12/1985 |
| JP | 4315935 | A | 11/1992 |
| JP | 9218104 | A | 8/1997 |
| JP | 2004303969 | A | 10/2004 |
| SU | 368349 | A1 | 1/1973 |
| WO | 94/29681 | A1 | 12/1994 |
| WO | 98/11412 | A1 | 3/1998 |
| WO | 00/63947 | A1 | 10/2000 |
| WO | 01/50109 | A2 | 7/2001 |
| WO | 02/33369 | A1 | 4/2002 |
| WO | 2005/052995 | A2 | 6/2005 |
| WO | 2010/120792 | A1 | 10/2010 |

OTHER PUBLICATIONS

V. Korotchenko et al., "Substrate temperature monitoring in plasma assisted processes", Vacuum, vol. 36, No. 1-3, pp. 61-65.

K. Setsune et al., "Epitaxial Y—Ba—Cu—O thin films prepared by rf-magnetron sputtering", J. Appl. Phys., vol. 64, No. 3, pp. 1318-1322.

M. Inoue et al., "A two-pyrometer method of measuring substrate temperature", J. Vac. Sci. Technol., 1991, vol. A9, No. 6, pp. 3165-3168.

R.A. Bonds et al., "Temperature measurements of glass substrate during plasma etching", J. Vac. Sci. Technol., 1980, vol. 18, No. 2, pp. 335-338.

E.G. Egerton et al., "Positive wafer temperature control to increase dry etch throughput and yield", Solid State Technol., Aug. 1982, pp. 84-87.

S.A. Shivashankar et al., "Calorimetry in thin film processing", J. Vac. Sci. Technol., 1986, vol. A4, No. 3, pp. 1826-1829.

J.P. Blanchard, "Target temperature prediction for plasma source ion implantation", J. Vac. Sci. Technol., 1994, vol. B12, No. 2, pp. 910-917.

X. Tian et al., "In situ temperature measurement in plasma immersion ion implantation", Rev. Sci. Instr. 1999, vol. 70, No. 6, pp. 2818-2821.

European Search Report for European Patent Application No. 12160874, dated Jun. 20, 2012.

Hewlett Packard 6N139 Technical Data, 1998.

European Office Action for European Patent Application No. 12160874, dated Sep. 27, 2013.

Office action for Ukrainian Patent Application No. a 2012 03043, dated Apr. 23, 2015.

Ukrainian Office Action for Ukrainian Patent Application No. a 2012 03043, dated Sep. 2, 2015.

* cited by examiner

DEPOSITION SUBSTRATE TEMPERATURE AND MONITORING

CROSS-REFERENCE TO RELATED APPLICATION

This is a continuation application of Ser. No. 13/070,846, filed Mar. 24, 2011, and entitled "Deposition Substrate Temperature and Monitoring", the disclosure of which is incorporated by reference herein in its entirety as if set forth at length.

BACKGROUND

In various fields (e.g., electronics, media, tool manufacturing, aircraft manufacturing, etc.), ion-enhanced processing is used for various kinds of workpiece treatment. The ion bombardment heats the workpiece and may cause microstructure and chemical element distribution profile changes, deformation, and even melting. This temperature is actively controlled.

As an example, ion-enhanced physical vapor deposition (IE-PVD) is widely used for coating various components (e.g., particularly for restoration of the airfoil profile of worn or damaged turbine blades). This technique is characterized either: by evaporation of a source material from a crucible by an electron beam; or by ion sputtering of a solid source material target and ion bombardment of condensate (deposited material) on the substrate (e.g., the blade). Ion bombardment provides enhanced adhesion and improved coating structure due to additional kinetic energy passed to ad-atoms. For ion bombardment, an ionizing discharge is formed in the vapor medium, and negative bias voltage is applied to the substrate (to accelerate positive ions extracted from the ionized vapor). To enhance process stability, the negative bias voltage is applied in a pulsed mode allowing control of duty cycle, pulse repetition frequency, and/or amplitude. See, US20040172826A1, Sep. 9, 2004 (U.S. '826). In that exemplary system, during the pre-deposition period (e.g., when loading a substrate holder with the workpiece(s), start heating, etc) and the coating process, the substrate can be moved (i.e., its location is not constant during coater setup and coating).

For formation of desired coating structure, it may be necessary to keep substrate temperature in a certain range during coating. With multicomponent alloy deposition, this range may be quite narrow. For example, U.S. '826 suggests that during deposition of two-phase Ti-6Al-4V substrate temperature should be kept in the range of 600-800° C.

Substrate temperature is affected by various factors: heat radiation from the melt pool in the crucible; substrate bombardment by high-energy electrons scattered by the melt pool; ion bombardment; and condensation of atoms out of vapor (latent condensation heat). As a result, substrate temperature can vary over a wide range, and substrate overheating may result. To avoid this, substrate temperature should be continuously measured in situ or simultaneously monitored and regulated in different ways, for example, by control of the duty cycle of bias voltage pulses.

In other situations, the temperature of a movable substrate (workpiece) may be measured with a thermocouple with wires brought out of the vacuum chamber through a sealed hollow sting shaft of the substrate holder. These wires are attached to the external measuring electric device through a rotating brush collector. See, for example, SU368349, Jan. 26, 1973 which involves deposition by evaporation. However, when the substrate is under high negative bias voltage (up to 10 kV) in an IE-PVD process, the direct connection of thermocouple wires to the grounded device is impractical.

Due to high electrical and magnetic fields in the ionizing plasma discharge there are additional problems involving electrical interference. The electrical interference may cause large temperature measuring errors in systems with high frequency or pulse power supply. Also, sparking and arcing on the workpiece can damage the measurement hardware.

Optical and electrically insulated thermocouple systems are used to avoid those problems.

Optical instruments for workpiece temperature measurement include pyrometers, laser interferometric systems, fluoro-optic thermometers, etc. Advantages of optical method are electrical isolation and avoiding electrical interference either due to a vacuum gap between the workpiece surface and parts of optical-electronic devices or due to a dielectric optic fiber connecting a temperature sensor and a reading system.

Pyrometers are often used for temperature measurement of substrates under high potential. For instance, an ordinary radiation pyrometer is disclosed in P. D. Parry, "Localized substrate heating during ion implantation", J. Vac. Sci. Technol., 1978, vol. 15, No 1, pp. 111-115. An adaptively calibrated pyrometer is disclosed in B. I. Choi et al., "In situ substrate temperature measurement in high-Tc superconducting film deposition", J. Vac. Sci. Technol., 1993, vol. All, No 6, pp. 3020-3025. Two-color or two-wave length infrared radiation is disclosed in: V. Korotchenko and A. Matthews, "Substrate temperature monitoring in plasma assisted processes", Vacuum, vol. 36, No 1-3, pp. 61-65; K. Setsune et al., "Epitaxial Y—Ba—Cu—O thin films prepared by rf-magnetron sputtering", J. Appl. Phys., vol. 64, No 3, pp. 1318-1322; and M. Inoue et al., "A two-pyrometer method of measuring substrate temperature", J. Vac. Sci. Technol., 1991, vol. A9, No 6, pp. 3165-3168. Increase of accuracy of pyrometrical measurements is achieved by actually ascertaining the emittance of the body whose temperature is being measured. For this purpose the light reflection from the body is measured. See, for example, patents: Patton U.S. Pat. No. 5,029,117; Boebel et al. WO9429681; and Boebel et al. U.S. Pat. No. 5,564,830.

A laser interferometric temperature measurement system contains a glass transparent plate in vicinity of the substrate. Thermal increase of optical thickness of the plate caused by its thermal expansion due to heating by substrate radiation leads to changes in the resulting interferogram and allows calculation of the temperature (See, e.g., R. A. Bonds et al., "Temperature measurements of glass substrate during plasma etching", J. Vac. Sci. Technol., 1980, vol. 18, No 2, pp. 335-338). The shadow effect provided by thermal expansion of the heated substrate is employed for temperature measuring in situ in Shirosaki JP9218104. Also, thermal deformation of substrate determined with help of a laser detector is used for substrate temperature monitoring in S. Inaba et al. JP2004303969.

Fluoro-optic temperature sensing systems have a phosphorescent probe (sensor) with temperature-dependent fluorescent decay time. The probe is placed near the substrate or attached to it and heated by heat radiation emitted by the substrate. A light pulse from flash lamp or LED is transmitted through an optic fiber to the sensor and excites the probe matter. After the light pulse is turned off, the decaying fluorescent signal continues to be transmitted through the fiber to the optic-electronic instrument, where a photosensitive detector registers the fluorescent signal. The measured decay time is then converted to a temperature value. See Wickersheim U.S. Pat. No. 4,560,286. Commercial fluoro-optic devices are available from the Luxtron unit of Luma Sense Technology, Inc. (Santa Clara, Calif.). The overall temperature range capability of this optical sensor technology is currently up to 330° C. Some variation of such an approach is presented in: Sato et al. JP4315935 and Ishikawa et al. U.S. Pat. No. 5,876,119. Examples employing such temperature sensors are described in E. G. Egerton et al., "Positive wafer temperature control to increase dry etch throughput and yield", Solid State Technol., 1982, August, pp. 84-87; S. A. Shivashankar and B. Robinson, "Calorimetry in thin film processing", J. Vac. Sci. Technol., 1986, vol. A4, No 3, pp. 1826-1829; and J. P. Blanchard, "Target temperature prediction for plasma source ion implantation", J. Vac. Sci. Technol., 1994, vol. B12, No 2, pp. 910-917.

In Yaroslaysky U.S. Pat. No. 6,596,339 and U.S. Pat. No. 6,709,519, the temperature dependence of reflectivity of UV light on more than one spectral component is used for in situ temperature measuring of substrate film materials.

Method and apparatus utilizing the diffusion reflectivity of substrate surface and the dependence of the interband optical absorption edge on temperature are disclosed in Johnson et al. U.S. Pat. No. 5,388,909 and U.S. Pat. No. 5,568,978; Denton et al. WO0150109; Johnson et al. WO0233369 and US2004061057; Taylor et al. US20050106876A1. The method is applicable mainly to semiconducting materials.

WO2005052995 purports to enhance accuracy of temperature measurements with optical instruments by including in the measuring procedure creation of a temperature calibration curve for an optical instrument with help of thermocouple.

A general disadvantage of optical temperature measurement systems is sensitivity of the temperature reading to: 1) emissivity of substrate surface (so that after every change of substrate, a calibration with thermocouple is needed; also, the emissivity of the substrate continuously changes during coating; 2) relative location of substrate and optical device (sensor), that cannot be strictly fixed for systems with movable substrate holders; 3) narrow range of measured temperatures (except pyrometers); 4) harmful deposition of evaporated and other materials onto the optical sensors and windows, as well as parasitic sputtering of dielectric optical elements by ions that leads to large errors in the temperature measurement.

Also, processing equipment with optical temperature measurement devices is rather complex and expensive.

Application of electrically insulated thermocouples is described in X. Tian et al., "In situ temperature measurement in plasma immersion ion implantation", Rev. Sci. Instr. 1999, vol. 70, No 6, pp. 2818-2821. A direct in situ temperature measurement technique employs a commercial K-type thermocouple attached directly to the workpiece. The thermocouple wire is insulated from the plasma and the grounded vacuum chamber wall through a quartz glass tube and a Teflon inlet at the chamber wall. The display meter is electrically floated together with the battery power supply. In Yukishige et al. JP 60 245 776, a sheathed thermocouple is inserted into a rotating substrate electrode under applied bias voltage to measure the electrode surface temperature and control the substrate temperature. Thermocouple leads go through a sealed hollow shaft to rotating brush collector contacts for connecting with external instruments. The thermoelectric method has three main advantages over the traditional use of a pyrometer and other optical sensors: 1) optical systems are calibrated for a certain temperature range, but the thermocouple approach can detect directly a wide range of temperatures; 2) pyrometers are usually set up outside of the chamber to aim at a certain point on the specimen, whereas the thermocouple may be attached in any suitable place; 3) the thermocouple unit is less costly.

However, that thermoelectric method and apparatus have disadvantages: 1) in safety precautions because the instruments cannot be touched when operating; 2) it may be needed to interrupt the ionizing discharge and application of the substrate bias voltage to get a good reading (because plasma process generates electrical noise and causes electrical interference, especially in pulse and RF modes of operation); 3) it is difficult to transmit measured signals to the grounded devices such as a signal processing unit, computer, and display; 4) the battery has limited service term that is especially significant for long deposition runs.

In R. W. Stitz et al., U.S. Pat. No. 4,632,056, a disk with attached thermocouple, located close to substrate and insulated from it, is used as a temperature sensor. Thermal radiation from the substrate affects the disk, so the thermocouple readings are related to the substrate temperature. However, this method is indirect and has low accuracy because of the influence of many disturbing factors, in particular due to variation of substrate surface radiation emissivity and disk surface absorptance. Also, accurate disk location relative to the substrate is needed which is difficult to achieve in a system with a movable substrate holder.

SUMMARY

One aspect of the disclosure provides an apparatus for depositing a coating on one or more parts. The apparatus has: a chamber; a part holder for carrying the part(s); a bias voltage source coupled to the part(s) to apply a bias voltage to the part(s); a source of the coating material; a plurality of temperature sensors; and a plurality of leads passing outputs of the temperature sensors out from the chamber. A temperature monitoring system has a temperature data processor. At least one fiber optic link couples the temperature data processor to the temperature sensors so as to electrically isolate the temperature data processor from the bias voltage.

This may provide such ion enhanced processing with simultaneous temperature monitoring of workpiece under high bias voltage that ensures a high quality treating of workpieces in long deposition runs. This may include direct thermocouple temperature measurement in situ with a high degree of accuracy and low sensitivity to electrical interference without interrupting either the ionizing discharge or application of the substrate bias voltage.

This may be implemented by employing an optoelectronic system with low-sensitivity to electrical interference. The system acquires high-voltage-floating-workpiece/substrate temperature data and transfers the data to grounded temperature signal processing units, computers, display devices and a temperature control system.

This may also provide low sensitivity of temperature monitoring to deposition of any material on thermocouple sensors during coating runs.

This may also provide a high level safety of using an apparatus for workpiece temperature monitoring.

The details of one or more embodiments are set forth in the accompanying drawings and the description below. Other features, objects, and advantages will be apparent from the description and drawings, and from the claims.

BRIEF DESCRIPTION OF THE DRAWINGS

An exemplary system is illustrated by way of example, and not by way of limitation, in the figures of the accompanying drawings.

Like reference numbers and designations in the various drawings indicate like elements.

DETAILED DESCRIPTION

An exemplary system and method involves ion-enhanced PVD with electron beam evaporation (EB-PVD) and creation of the ionizing discharge in the vapor flow. Similar principles may be applied to other similar ion enhanced treating of workpieces under bias voltage (e.g., plasma assisted CVD of coatings onto the workpiece, ion cleaning or plasma thermochemical treating of its surface, and plasma immersion ion implantation into the workpiece body).

Figure 1:
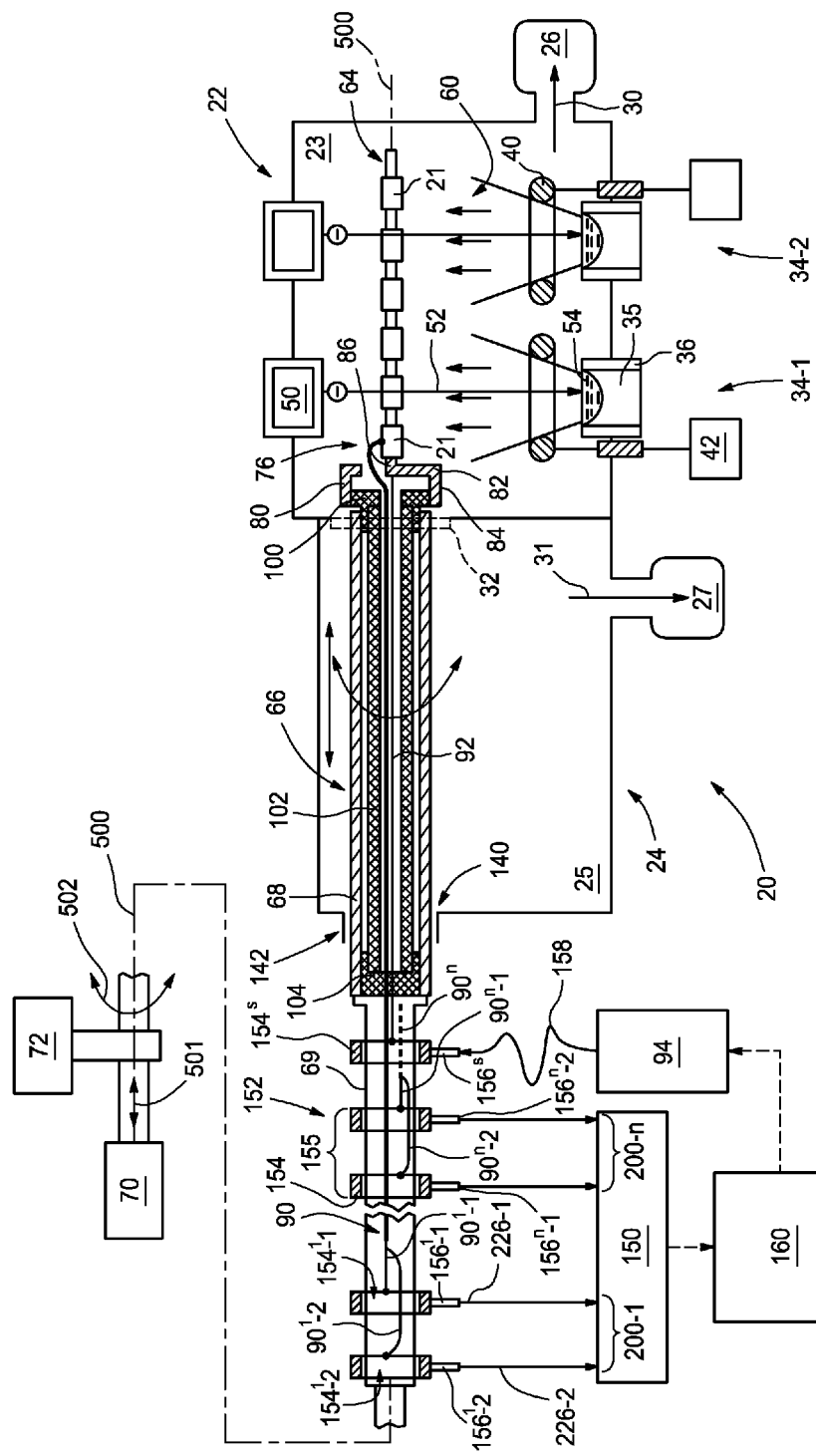
FIG. 1 is a simplified diagram of a processing system for ion enhanced PVD of coatings with simultaneous temperature monitoring of substrates.

FIG. 1 schematically shows a functional diagram of ion enhanced EB-PVD system 20 with substrates 21 under high bias voltage. The system 20 comprises: a coating chamber 22 (having an interior 23); and a load lock chamber 24 (having an interior 25) allowing insertion of new substrate into the coating chamber and extraction of coated substrates from the chamber while not admitting atmospheric air. Both the coating chamber and load lock chamber are provided with high vacuum systems 26, 27 for pumping out their interiors prior to coating (arrows 30, 31 denote the direction of pumping out). Door 32 is closable and openable to respectively isolate and connect the interiors of chambers 22 and 24 with each other.

The exemplary system is a dual-source system with two sources 34-1 and 34-2 of material to be deposited. For each source, materials to be evaporated (e.g., from an associated ingot 35) may be fed into the coating chamber interior such as through an associated crucible 36 (e.g., water-cooled).

In each exemplary source 34-1, 34-2, a discharge anode 40 is located above the respective crucible 36. Power supply sources 42 are respectively connected to the anodes 40 to ignite and support an ionizing discharge. Electron guns 50 generate electron beams 52 which are initially scanned over the upper end surfaces of the ingots to heat the ingots to create and then maintain a melt pool 54 and cause evaporation of material from the melt pool. This forms vapor fluxes 60 above each crucible, and these fluxes are ionized by electrical discharge supported with help of the respective anodes 40.

The substrates are held by a substrate holder 64 (e.g., a carousel or linear fixture) just above the crucibles. The exemplary holder is part of a sting system 66. The sting system includes a main shaft (e.g., a hollow shaft) 68 to which the holder 64 is mounted. The shaft 68 is mechanically assembled to a root portion/support 69. The exemplary root portion 69 is, at all times, in the atmospheric air (outside the vacuum) and supports a system of rotating contacts (a rotation brush collector). The root portion 69 transfers torque and force from mechanical actuators 70, 72 to the sting shaft 68. A first actuator 70, mechanically connected with the root portion 69, may axially shift the sting along an axis 500 (the shifting directions are depicted by bidirectional arrow 501) to shift the holder 64 together with substrates 21 between the load lock chamber 24 and coating chamber 22. A second actuator 72, also mechanically connected with the root portion 69, may rotate the shaft 68 about the axis 500 (the rotation directions are depicted by bidirectional arrow 502). The actuators 70 and 72 may be of types well known in electromechanical engineering and used in systems for shaft rotation and linear movement (e.g., electric motors with reduction gearing).

FIG. 1 shows an example of a two-crucible evaporation system that facilitates uniform coating deposition onto a plurality of substrates simultaneously. Various different kinds of ionizing discharge may be used: direct current (DC); alternating current (AC, <1 KHz); mid-frequency (MF, ~1-100 kHz); radio frequency (RF, ~0.1-1000 MHz); and microwave (MW, >1 GHz) and either as arc or glow type. The discharge may be continuously supported (continuous wave discharge) or pulse modulated.

Figure 3:
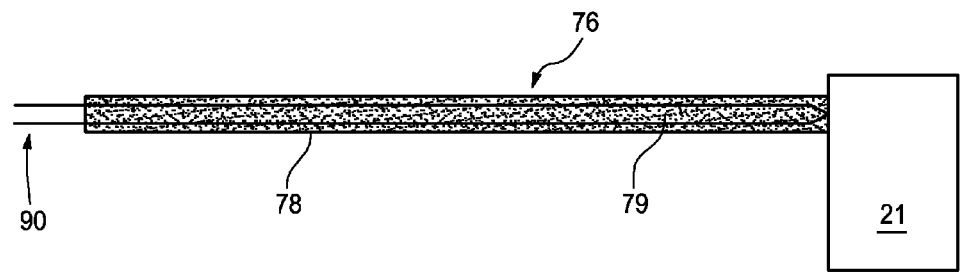
FIG. 3 is an isolated view of a thermocouple.

Substrate temperatures may be monitored. Exemplary temperature sensors 76 are thermocouples attached to some or to all substrates (e.g., to select substrates) in the center and/or on the periphery of holder 64. FIG. 1 depicts, as an example, one thermocouple 76 fixed to a peripheral substrate. These substrates play the role of witnesses for temperature monitoring across the holder area. The thermocouples may be placed into fine metal pipes (sheathes) to avoid electrical interference and deposition of evaporated or sputtered species directly onto thermocouple wires. FIG. 3 shows an example of such a sheathed thermocouple contacting a substrate/witness body 21. In FIG. 3, thermocouple wires (leads) are shown as 90, a metal sheath is shown as 78 and has a closed distal end, and 79 is an isolation material (e.g., powder alumina ($Al_2O_3$)). Commercial thermocouples in fine metal pipe sheathes are well known in the thermal measurement industry (e.g., available from Omega Engineering, Inc. of Stamford, Conn.).

The exemplary holder 64 is fixed to the sting shaft 68 with an adaptor 80. An exemplary adaptor 80 comprises a metal part 82 in the form of a round box having a sidewall 84 and a distal web 86 to which the holder 64 is mounted as shown in FIG. 1. Thermocouple leads 90 (shown/labeled as pairs of leads ($90^1$-1 and $90^1$-2; $90^2$-1 and $90^2$-2; . . . $90^n$-1 and $90^n$-2) shown and respectively collectively designated as a first lead 90-1 and second lead 90-2) for each thermocouple) and a bias voltage conductor 92 (which connects holder 64 to a substrate bias power supply 94), pass through the adaptor 80 and the hollow sting shaft 68 to a system of rotating contacts (a rotating brush collector) described below.

The power supply 94 generates a negative bias voltage to attract ions from the ionizing discharge plasma(s) to the substrates. In an exemplary embodiment, power supply 94 comprises a pulse modulator of substrate bias voltage. The pulse modulation may be controlled to: provide process stability across different production runs; avoid arcing on substrate surfaces; regulate substrate temperature by control of duty cycle or pulse repetition frequency, or amplitude; and provide only surface heating by employing short pulses. See, e.g., U.S. '826.

Thermocouple leads 90 and conductor 92 are insulated from the grounded shaft 68 (e.g., stainless steel or other vacuum-compatible metal) by an isolator 100, an insulating shield 102 and an insulating vacuum seal (an isolator) 104. The exemplary isolator 100 may be ceramic (e.g., $Al_2O_3$-based), the exemplary insulating shield 102 may be a polymeric (e.g., PTFE) tube, and the insulating vacuum seal/isolator 104 may also be polymer (e.g., PTFE). The isolator 100 is mechanically assembled with the metal part (e.g., a round box of stainless or other steel) 82 of the adapter 80 at one end, and with the shaft 68 at the other end. The exemplary isolator 100 has a radial flange extending outward to engage the metal part 82 and an annular collar extending axially from the flange captured between the shaft 68 and the shield 102 so that the shield 102 is received in an annular compartment between the flange and collar. The isolator 104 may similarly engage opposite ends of the shaft 68 and shield 102. Thus, the isolator 100 is able not only to electrically isolate the holder 64 from the shaft 68 but also to transmit mechanical torque and force to the holder 64 from the shaft (from the actuators 70 and 72). The exemplary root portion 69 may be formed of stainless or other steel and having mounting flange at an end engaging the isolator 104 (e.g., bolted thereto).

The adaptor 80 serves as a shield for isolator 100 to prevent deposition of evaporated and other species onto the isolator and ensure its high electrical isolation of high values of bias voltage (e.g., up to 10 kV or higher). Deposition of metal and other species onto the isolator might create a conducting path for parasitic current, sparking, arcing, electrical breakdown and short circuit between the high-potential substrate holder and the grounded sting shaft. Shaft 68 passes through a proximal port 140 in the load lock chamber 24. The exemplary port 140 includes a vacuum seal 142. Thermocouple leads 90 and conductor 92 pass through the insulating vacuum seal 104 and connect to temperature monitoring system 150 and the substrate bias pulse power supply 94, respectively, through the rotating brush collector 152 with electrodes 154. For each thermocouple, a pair 155 of rotating electrodes (e.g., 154$^1$-1 and 154$^1$-2 through 154$^n$-1 and 154$^n$-2) in the form of ring contacts engaging non-rotating brushes 156 (e.g., 156$^1$-1 and 156$^1$-2 through 156$^n$-1 and 156$^n$-2) is employed. Accordingly, a rotating ring electrode 154$^s$ together with a non-rotating brush 156$_s$ is employed for applying the bias voltage to the substrate from the pulse power supply 94. The exemplary rotating ring electrodes 154 are rigidly fixed by supporting isolators (not shown) to the root portion 69 of the sting system 66 to provide their synchronous rotation. The non-rotating brushes 156 are also disposed on isolators (not shown) and can move along the axis 500 together with the shaft 68 and root portion 69. Thus, this ensures high-voltage isolation of the electrodes 154 and the brushes 156 relative to the grounded parts and allows the rotation and axial movement of the shaft and holder. A signal from the temperature monitoring system 150 may go to an automatic temperature control system 160 that can control source 94 to provide feedback temperature control by regulating parameters of substrate bias voltage. Such parameters may be bias voltage amplitude, pulse rate, duty cycle (or pulse duration). A signal from the temperature monitoring system 150 may also go to another registration or control unit, or to displays.

The thermocouple signal inputs of the system 150 are at high voltage potential relative to the ground but the signal outputs of this system are at the ground potential because inputs of the control system 160 and other registration or control units, or displays are also at the ground potential. Therefore, the system 150 is divided into two portions operating at different potentials but jointed via a flexible optic cable, which has essentially no electrical conductivity. Details of the system 150 are described below. The exemplary/high-potential portion of the system 150 is disposed on an isolator (not shown) and able to move axially along the axis 500 together with the sting system 66 and the rotating brush collector 152. The ground-potential portion of the system 150 may be motionless (stationary). The substrate bias voltage is applied to the brush 154$^s$ and then to the rotating ring electrode 156$^s$ of the rotating brush collector 152 via a flexible electric cable 158. Flexibility of the cable 158 allows shifting of the sting system 66 together with the rotating brush collector 152 axially along the axis 500 while the substrate bias pulse power supply 94 is motionless (stationary).

Figure 2:
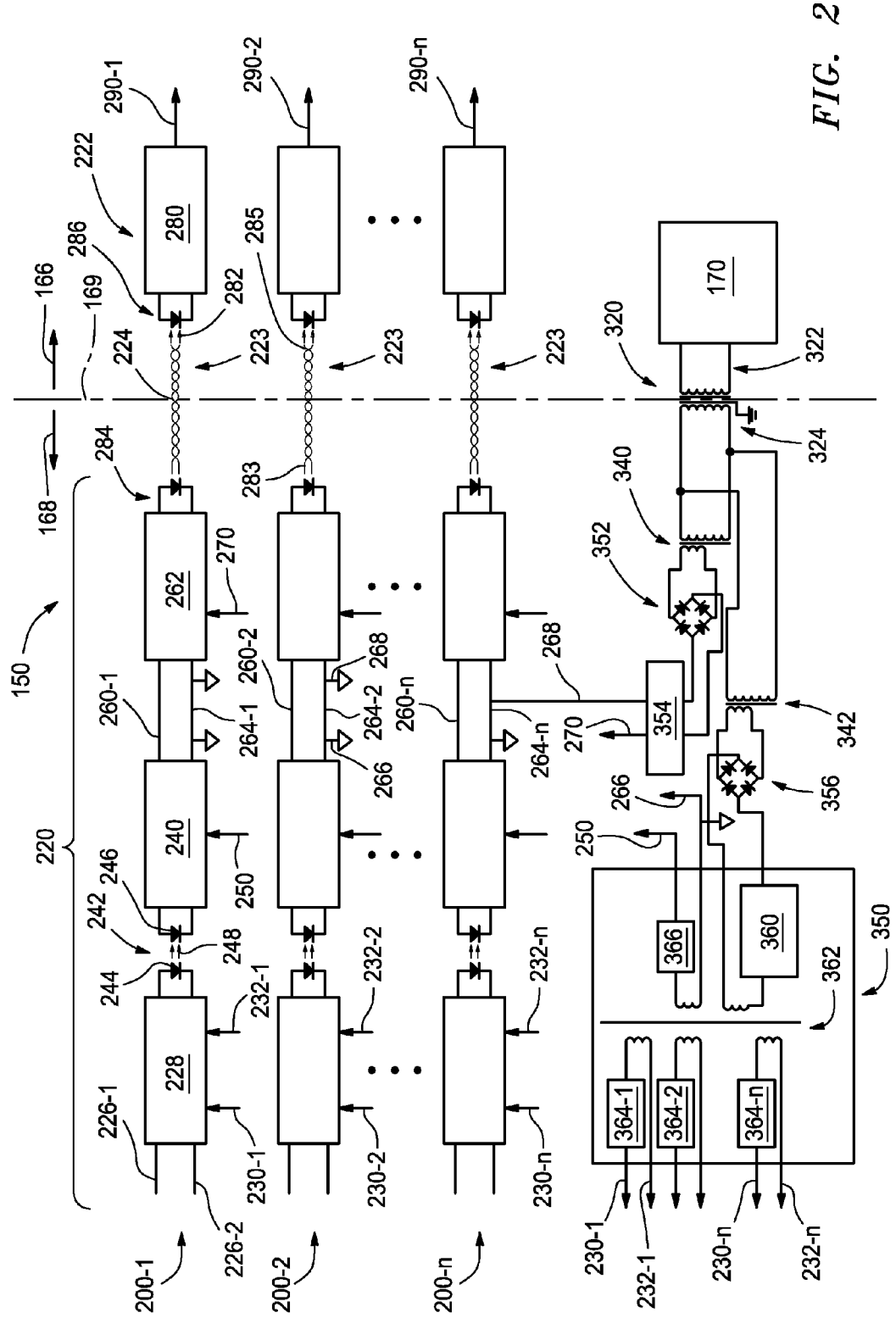
FIG. 2 is a simplified electronic diagram for temperature monitoring of substrates under bias voltage.

FIG. 2 shows how thermocouple signals are transferred from the substrate holder (which floats at high potential) to a grounded portion 166 of the temperature monitoring system 150 in conditions of electrical interference. The higher voltage portion is shown as 168 with a boundary 169 between. Thus, galvanic decouplings (electrical isolation) of the thermocouples from grounded measurement apparatus are used. This galvanic decoupling allows not only the high potential difference between the portions 166 and 168, but also neutralizes the impact of electrical noise (e.g., caused by the pulse nature of the high voltage substrate bias and other electrical noise-generating processes in the deposition apparatus). Galvanic decoupling avoids direct electrical links between different parts of a system, hence, there are no common currents via the different parts, and processes and signals in one part do not affect processes and signals in the other parts. This neutralizes impact of pulsed high voltage and induced electrical noise. This may also provide minimization of electrical interference between different parts of the temperature monitoring system through the AC power supply 170 (e.g., connected to the industrial power supply (main) of 220/110 V, 50/60 Hz).

In general, n channels are used for temperature monitoring, where n is the number of thermocouples or the number of substrate witnesses. Commonly, the number of thermocouples equals the number of substrate witnesses (a dummy substrate may be employed as a witness), but, in the case of large substrate, several thermocouples may be used to determine temperature distribution on different portions of the substrate. Each thermocouple is connected to its channel 200 (200-1, 200-2, and 200-n shown in FIGS. 1 and 2) via its associated insulated wires (wires 90$^1$-1, 90$^1$-2 and 90$^n$-1, 90$^n$-2 shown in FIG. 1) and rotating electrode pairs 155 of the brush collector 152. Each exemplary channel consists of a first part 220, floating at a high potential relatively the ground, and a second part 222 at the ground potential. The parts 220, 222 are connected to each other by means of a fiber optic link (optic cable) 223 having an optical fiber (optofiber) 224 that transfers the thermocouple signal (e.g., in the form of frequency-modulated light pulses). Because the optofiber is made from a high dielectric material (e.g., fused quartz, glass or polymer) and has a sufficient length (e.g., at least 1 m), it ensures electrical decoupling of both the parts over the anticipated range of difference of potential across the boundary 169.

For each channel, the associated thermocouple provides signals over a first conductor 226-1 and a second conductor 226-2. These are received by an associated preamplifier (e.g., provided with an input RC low-pass filter) 228. The term "preamplifier" means "primary (first) signal amplifier". Each preamplifier 228 has associated filtered power supply voltage inputs: a first input 230 (230-1, 230-2, and 230-n are shown); and a second input 232 (232-1, 232-2, and 232-n are shown). The generation of these inputs is discussed several paragraphs below. For each channel, the preamplifier 228 is coupled to an associated low-pass active filter 240 (e.g., of higher rank (e.g., with damping up to 60 decibel/octave) and of higher linearity in the bandpass than the input filter in the preamplifier 228) by means of an optical isolator (namely, a non-fiber optic optical isolator such as an optocouple, optopair or optron) 242. Each exemplary optical isolator comprises a light-emitting diode (LED) 244 connected across the outputs of the preamplifier 228 and a photodiode 246 connected across the inputs of the low-pass filter 240. Each LED is in optical communication (shown as light arrows 248) with its associated photodiode. Each low-pass filter 240 has a first filtered power supply voltage input 250 (described several paragraphs below). Each low-pass filter 240 has an associated output 260 (260-1, 260-2, and 260-$n$ shown). This becomes a first input to an associated voltage-to-frequency converter 262. A second line 264 (264-1, 264-2, and 264-$n$ shown) connects the second output of the low-pass filter 240 to the second input of the voltage-to-frequency converter 262. These lines 264 are, however, connected in common to a single power supply filter common 266 and a single power supply converter common 268. The converters 262 also have a first filtered power supply voltage input 270 (described several paragraphs below). As is discussed above, each voltage-to-frequency converter 262 is coupled to an associated frequency-to-voltage converter 280 by the optofiber 224. The exemplary optofiber conveys light 282 at a first end 283 from a LED 284 (coupled to the outputs of the voltage-to-frequency converter 262) through a second end 285 to a photodiode 286 (coupled to the inputs of the frequency-to-voltage converter 280). Each frequency-to-voltage converter 280 has an associated signal output 290 (290-1, 290-2, and 290-$n$ shown) relative to the ground.

Figure 4:
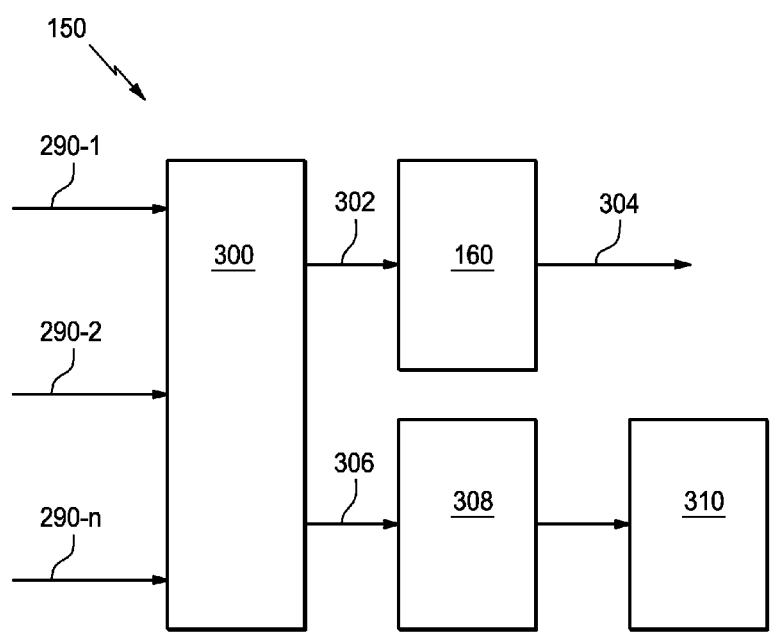
FIG. 4 is a partial view of the temperature monitoring system of the system of FIG. 1.

FIG. 4 shows further portions of the temperature monitoring system 150. The outputs 290 of frequency-to-voltage converters 280 are connected with corresponding inputs of associated analog-digital converters (ADC) (not shown) of a temperature data digital processor 300 (e.g., a computer) of the temperature monitoring system 150. The first output 302 of the processor 300 is connected to the automatic temperature control system 160. An output 304 of the system 160 is connected to the bias power source 94 (see, FIG. 1) to provide feedback temperature control by regulating parameters of substrate bias voltage. Such parameters may be bias voltage amplitude, pulse rate, and duty cycle (or pulse duration). The second outputs 306 of the processor 300 are connected to a temperature registration/recording unit 308 provided with one or more temperature monitors 310 (e.g., a display or digital indicator devices for showing temperature of one or more substrate witnesses as discussed below).

In FIG. 2, isolation may also be provided for portions of the power circuitry on the respective low voltage side 166 and high voltage side 168. Initial isolation of the power supply 170 is provided by an isolation transformer 320 with high electrical hold-off ability. The transformer 320 has an exemplary first winding 322 connected to the power supply 170 on the low voltage side and a second winding 324 on the high voltage side. An exemplary difference across the boundary may be up to approximately 10 kV for many systems (although higher for others). This can obviate the need for battery power of the high voltage side, thereby removing the run time limits imposed by use of a battery.

The preamplifiers 228 (e.g., differential DC amplifiers) amplify signals provided by the corresponding thermocouples. The signals are preliminarily filtered by the preamplifiers' input RC low-pass filters (e.g., with cutoff frequency of about 2 Hz). After amplifying, the signals go to the optocouples 242 for electrical isolation of the preamplifiers from the following cascades and avoiding electrical interference. Such interference may be caused by several reasons.

A first reason for electrical interference is that the thermocouples are set on the substrate witnesses fixed on a single substrate holder 64. Although the holder is conductive, there is some potential difference between different points where the thermocouples are (the potential difference is generated by the substrate current passing along the holder 64). Therefore this potential difference adds to very small thermocouple signals if electrical wires of the preamplifiers 228 have another common point. However, due to galvanic decoupling of all signal circuits of different preamplifiers there are no other common points.

The second reason for electrical interference is electromagnetic induction in the deposition apparatus (facilities) generated by: the substrate bias power source (especially if it is pulsed one); EB power sources; ionizing discharge; etc. The wires of thermocouples and the temperature monitoring system 150 act as antennas. For instance, such an antenna may be formed by the thermocouple leads 90 passing within the hollow sting shaft 68 side by side with the conductor (wire) 92 applying pulse bias voltage to the substrate holder 64 (FIG. 1). The leads 90 have capacitive as well as inductive coupling with the conductor 92. The latter may have high bias potential, hence, there are some alternating electrical fields (may be of high frequency, that is some hundred kilohertz or up to some megahertz, because pulses of bias voltage contain many high frequency harmonics) between the conductor 92 and the thermocouple leads and electrical induction of parasitic signals in thermocouple circuits (the electrical induction magnitude is approximately proportional to the frequency of the alternating field). The conductor 92 passes an electrical current (equal to the ion substrate current). Hence, there also is magnetic induction of parasitic signals in the thermocouple circuits. Galvanic decoupling together with electromagnetic screening of the thermocouple leads and the preamplifiers as well as thermocouple signal filtration reduce/limit the influence of external electromagnetic fields. Exemplary optocouples 242 have electrical hold-off ability up to 1.5 kV; they operate in the linear mode and provide transmission of analog signals practically without distortion. Then the signals go to the low-pass active filters 240, which realize damping for 2 Hz cutoff frequency of 60 decibel/octave with a necessary linearity in the bandpass. This provides effective suppression of electrical noise of higher frequencies (in particular, the noise induced by the circuit for bias pulse voltage applying) and increases signal-to-noise ratio. The linearity ensures precise temperature monitoring.

In the power circuit, for additional electrical decoupling between cascades in the parts floating at high potential as well as for suppression of mutual electrical interference and induction of parasitic signals via the power supply circuits including via the power source 170 and the industrial power supply lines (main) (not shown) of 50/60 Hz, two decoupling transformers 340 and 342 are used in combination with a DC/DC converter 350. All electrical parts, units, devices, etc. in the deposition apparatus are connected in some way with the industrial power supply lines which provide the primary power source. Therefore, there is always the danger/possibility of mutual interference between these various parts via/through such lines. Use of decoupling transformers addresses this problem. Transformer 340, rectifying bridge 352 and voltage stabilizer 354 provide a power supply for the voltage-frequency converters 262. Transformer 342 and rectifying bridge 356 provide power supply of DC/DC converter 350. The exemplary converter 350 consists of: a DC/AC converter 360 (e.g., with an operational frequency 10 MHz); an RF decoupling transformer 362; AC/DC converters 364 (364-1, 364-2, and 364-$n$ shown) for separate power supply of each preamplifiers 228; and an AC/DC converter 366 for supplying the inputs at 250 and 266 for the low-pass filters 240. The DC/DC converter 350 and its parts (DC/AC converter 360, AC/DC converters 364 and AC/DC converter 366) may be of conventional types. Thus, the use of separate power supply of each preamplifiers 228 with the separate AC/DC converters 364 provides total galvanic decoupling of the preamplifiers via power supply circuits and prevents their electrical coupling. This avoids common closed currents via (through) the preamplifier's circuits, which would lead to mutual electrical interference and generate noise (parasitic) signals. The exemplary power supply of the low-pass active filters 240 is common (single/shared) for all filters (the wires 250 and 266 are common) for simplification of the power supply circuitry. Also for further simplification of the power supply circuitry, the exemplary power supply of the voltage-frequency converters 262 is single (the wires 268 and 270 are common) for all converters 262. Experiments have demonstrated no electrical interference between different low-pass active filters 240 and voltage-frequency converters 262 at such approach.

Thus, there is a hierarchy of galvanic decouplings between the first and further cascades of the temperature monitoring system 150 and fine filtration of thermocouple signals from induced electrical noise to ensure accuracy of temperature measurement/monitoring and provide precision automatic temperature control. Herein, galvanic decoupling for the first preamplifiers is of the highest level as we use decoupling between signal wires (circuits) due to the optical isolators, on the one hand, and decoupling between power supply circuits due to use of the separate power supply sources, on the other hand, as between different preamplifiers as well between preamplifiers and the further cascades (e.g., the filters 240, etc. downstream of preamplifiers 228). Any common currents passing through the different preamplifiers and cascades and creating electrical interference (as well as any transfer of signal from one measuring channel 200-1 through 200-n into the others) are avoided. This all provides accuracy of temperature monitoring and may also provide a high level safety of using an apparatus for workpiece temperature monitoring.

An exemplary coating is Ti-6Al-4V used to coat or locally repair gas turbine engine blades formed of the same material.

In an exemplary operational cycle, the sting assembly is initially retracted with the substrate holder in the load lock chamber and the door 32 closed. The load lock chamber contains atmospheric air. Workpieces/substrates to be coated are mounted to the holder. One or more (if needed) thermocouples are attached to the samples used as witnesses. Then the load lock chamber is closed and pumped down to high vacuum. Meantime, coating chamber 22 is constantly being pumped out a vacuum system 26 down to an exemplary pressure of $10^{-3}$ Pa or less. Ingots in crucibles are heated with electron beams to form liquid melt pools 54 and controlled to reach a stable evaporation regime. Then door 32 is opened and sting shaft inserted to shift holder 64 from load lock chamber 24 into the main chamber 22 and fixed into the deposition axial position so that holder 64 with substrates 21 is located above crucibles 36. At this stage, holder 64 is shadowed from crucibles 36 with a shutter (not shown).

In the case of substrates that have a particular preferred orientation (e.g., only one face of the substrate is being coated) the sting assembly may be inserted with these faces in a face-up orientation to minimize deposition on the coated surfaces of any non-desired species. The holder and substrates 21 may be preheated to needed temperature with an additional electron beam (not shown) and/or radiation from the shutter shadowing the holder from the crucibles. Power supplies 42 are switched on and the ionizing discharges are ignited and then maintained in between the liquid pools and anodes 40. The vapor discharge plasma spreads throughout in the chamber volume. The substrate bias pulse power supply 94 is turned on and afterwards negative bias voltage (with high duty cycle to provide acceptable adhesion of coating to substrate) is applied to the holder 64 through conductor 92. The shutter shadowing the holder 64 is opened. If the holder was inserted into the coating chamber with the substrates facing upwards, then it is rotated about the axis 500 to orientate substrate surfaces to be coated downward. Positive plasma ions are accelerated by bias voltage and bombard the substrate surface and the ion enhanced deposition starts.

Temperature of substrates is continuously measured with thermocouples, monitored by system 150 and controlled with system 160. An exemplary high duty cycle (about 0.9) of bias voltage is applied to holder 64 during first stages of deposition for high bond strength. This high duty cycle is not needed during the whole process as such high duty cycle can often lead to overheating of the substrates. In the exemplary implementation, this overheating is prevented by automatic temperature control system 160 that provides feedback control through the modulation of substrate bias pulse power supply 94. If temperature of the substrates rises above a prescribed upper limit (or decreases below a prescribed lower limit), duty cycle is reduced (or increased), to hold temperature of substrates in a needed range during the whole deposition process. When coating of the substrates is finished, the door 32 is opened and the sting assembly is retracted to withdraw/retract the holder 64 and substrates 21 from the coating chamber into the load lock chamber. The door 32 may be re-closed. The load lock chamber vacuum may be broken to atmosphere and the access door opened. The coated substrates may be removed. The thermocouples may also be removed. New substrates may be installed to the holder and the thermocouples (or new thermocouples) may be attached to the new substrates. These cycles continue as described above.

Due to use of several samples with attached thermocouples as temperature witnesses the measured temperature is close to the temperature of other samples with the same shape and material but without thermocouples. Such approach is useful for correct temperature monitoring.

One or more embodiments have been described. Nevertheless, it will be understood that various modifications may be made. For example, the principles may be applied to modify an existing coating system. In such situations, details of the existing system may influence details of any particular implementation. Similarly, details of particular substrates and coatings may influence details of any particular implementation. Accordingly, other embodiments are within the scope of the following claims.

What is claimed is:

1. An apparatus for depositing a coating on one or more part(s) (21), the apparatus comprising:
    a chamber (22);
    a part holder (64) for carrying the part(s) (21);
    a bias voltage source (94) coupled to the part(s) to apply a bias voltage to the part(s);
    a source (34) of the coating material;
    a plurality of temperature sensors (76);
    a plurality of leads (90) passing outputs of the temperature sensors out from the chamber;
    a temperature monitoring system (150) comprising a temperature data processor (300); and a plurality of fiber optic links (223) coupling the temperature data processor to the temperature sensors so as to electrically isolate the temperature data processor from the bias voltage, for each temperature sensor, the apparatus comprises:
an associated fiber optic link of said plurality of fiber optic links (223);
an optical isolator (242) between the temperature sensor and the associated fiber optic link;
a preamplifier (228) receiving output of the associated one of the temperature sensors;
a low-pass filter (240);
the associated said optical isolator (242) between the preamplifier and the low-pass filter; and
a voltage-to-frequency converter (262) between the low-pass filter and the associated one of the fiber optic links (223); and
a frequency-to-voltage converter (280) between the associated one of the fiber optic links and the temperature data processor (300).

2. The apparatus of claim 1 wherein:
the temperature monitoring system comprises a temperature registration/recording unit (308) with one or more temperature monitors (310).

3. The apparatus of claim 1 further comprising:
an automatic temperature control system (160) connected with the temperature data processor (300) at the input and with the bias voltage source (94) at the output to provide feedback temperature control by regulating parameters of the bias voltage applied to the part(s).

4. The apparatus of claim 1 wherein:
the source of coating material comprises an ingot (35) and an electron beam source (50) positioned to direct a beam (52) to the ingot.

5. The apparatus of claim 1 wherein:
the part holder is on a sting assembly shiftable between:
an inserted condition where the sting assembly holds the part(s) within the chamber for coating; and
a retracted condition where the sting assembly holds the part(s) outside of the chamber; and
the source of the coating material is positioned to direct a flow of the coating material to the part(s) in the inserted condition.

6. The apparatus of claim 1 wherein:
the temperature sensors are a plurality of thermocouples.

7. The apparatus of claim 1 wherein each of the fiber optic links comprises:
a light-emitting diode (LED) (284); a photodiode (286); and a flexible optical fiber (224) positioned to carry light from the LED to the photodiode.

8. The apparatus of claim 7 wherein:
the optical fiber has a length of at least 1 meter.

9. The apparatus of claim 1 wherein:
a rotating brush collector (152) conveys outputs of the temperature sensors.

10. The apparatus of claim 9 wherein:
the rotating brush collector also conveys the bias voltage from the bias voltage source to the part(s).

11. The apparatus of claim 4 wherein:
the temperature sensors are a plurality of thermocouples.

12. The apparatus of claim 11 wherein for each one of the temperature sensors, the apparatus comprises:
a first AC/DC converter (364) supplying the associated preamplifier (228).

13. The apparatus of claim 12 further comprising:
a voltage stabilizer (354) coupled to supply power to the voltage-to-frequency converters (262); and
a second AC/DC converter (366) for supplying power to the low pass filters (240).

14. The apparatus of claim 13 further comprising:
a first decoupling transformer (340) and a first rectifying bridge (352) for supplying power to the voltage stabilizer (354); and
a second decoupling transformer (342) and a second rectifying bridge (356) for supplying power to an RF decoupling transformer (362) by a DC/AC converter (360) for powering the first AC/DC converters (364) supplying the associated preamplifiers (228).

15. The apparatus of claim 14 further comprising;
an isolation transformer (320) between a power supply (170) and the first and second decoupling transformers (340,342).

16. The apparatus of claim 1 wherein the optical isolator is a non-fiber optic optical isolator.

17. The apparatus of claim 1 wherein:
for each of the of the frequency-to-voltage converter (280), the temperature data processor (300) comprises a corresponding analog-digital converter connected to a corresponding output of the frequency-to-voltage converter.

* * * * *